US011978521B2

(12) United States Patent
Liu

(10) Patent No.: US 11,978,521 B2
(45) Date of Patent: *May 7, 2024

(54) LATCH CIRCUITS WITH IMPROVED SINGLE EVENT UPSET IMMUNITY AND RELATED SYSTEMS, APPARATUSES, AND METHODS

(71) Applicant: Micron Technology, Inc., Boise, ID (US)

(72) Inventor: Liang Liu, Shanghai (CN)

(73) Assignee: Micron Technologies, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/937,532

(22) Filed: Oct. 3, 2022

(65) Prior Publication Data

US 2023/0024008 A1    Jan. 26, 2023

Related U.S. Application Data

(63) Continuation of application No. 17/003,363, filed on Aug. 26, 2020, now Pat. No. 11,462,283.

(51) Int. Cl.
*G11C 17/18* (2006.01)
*G11C 17/16* (2006.01)

(52) U.S. Cl.
CPC .............. *G11C 17/18* (2013.01); *G11C 17/16* (2013.01)

(58) Field of Classification Search
CPC ................................ G11C 17/18; G11C 17/16
USPC ......................................................... 365/96
See application file for complete search history.

(56) References Cited

U.S. PATENT DOCUMENTS

| 5,450,026 | A | 9/1995 | Morano |
| 8,912,841 | B1 | 12/2014 | Hwang et al. |
| 10,734,067 | B1 | 8/2020 | Akamatsu et al. |
| 10,804,884 | B1 | 10/2020 | Tsai et al. |
| 11,462,283 | B2 * | 10/2022 | Liu ........................ G11C 17/16 |
| 2002/0133769 | A1 | 9/2002 | Cowles et al. |
| 2005/0007854 | A1 | 1/2005 | Imondi |
| 2013/0215685 | A1 | 8/2013 | Chand Sk |
| 2017/0031632 | A1 | 2/2017 | Yun et al. |

(Continued)

FOREIGN PATENT DOCUMENTS

CN        109074833 B      12/2019

OTHER PUBLICATIONS

Chinese Notice of Allowance for Application No. 202110885336.0 dated Jan. 13, 2023, 5 pages.

*Primary Examiner* — Huan Hoang
*Assistant Examiner* — Minh Dinh
(74) *Attorney, Agent, or Firm* — TraskBritt

(57) ABSTRACT

Latch circuits with improved single event upset immunity and related systems, apparatuses, and methods are disclosed. An apparatus includes a fuse, a first driver circuit, and a second driver circuit. The fuse is configured to store a bit of information. The first driver circuit includes a first input terminal electrically connected to the fuse and a first output terminal electrically connected to a first latch input terminal. The second driver circuit includes a second input terminal electrically connected to the fuse and a second output terminal electrically connected to a second latch input terminal. The second latch input terminal is electrically isolated from the first latch input terminal by the first driver circuit and the second driver circuit.

20 Claims, 5 Drawing Sheets

(56) References Cited

U.S. PATENT DOCUMENTS

2017/0278559 A1    9/2017  Hush
2018/0130518 A1    5/2018  Ko
2021/0264997 A1*   8/2021  Chu ..................... G11C 17/18

* cited by examiner

LATCH CIRCUITS WITH IMPROVED SINGLE EVENT UPSET IMMUNITY AND RELATED SYSTEMS, APPARATUSES, AND METHODS

CROSS-REFERENCE TO RELATED APPLICATION

This application is a continuation of U.S. patent application Ser. No. 17/003,363, filed Aug. 26, 2020, now U.S. Pat. No. 11,462,283, issued Oct. 4, 2022, the disclosure of which is hereby incorporated herein in its entirety by this reference.

TECHNICAL FIELD

This disclosure relates generally to latch circuits having improved single event upset (SEU) immunity, and more specifically to latch circuits that may be used to read information bits stored to data storage elements in memory devices.

BACKGROUND

Latches may be used in memory devices to read and store bits from data storage elements such as fuses, anti-fuses, Flash memory elements, and dynamic random access memory (DRAM) capacitive storage elements. Dual interlocked storage cell (DICE) latches are sometimes used because of their tolerance to SEUs, which results from their dual interlocked structure.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

Figure 1:
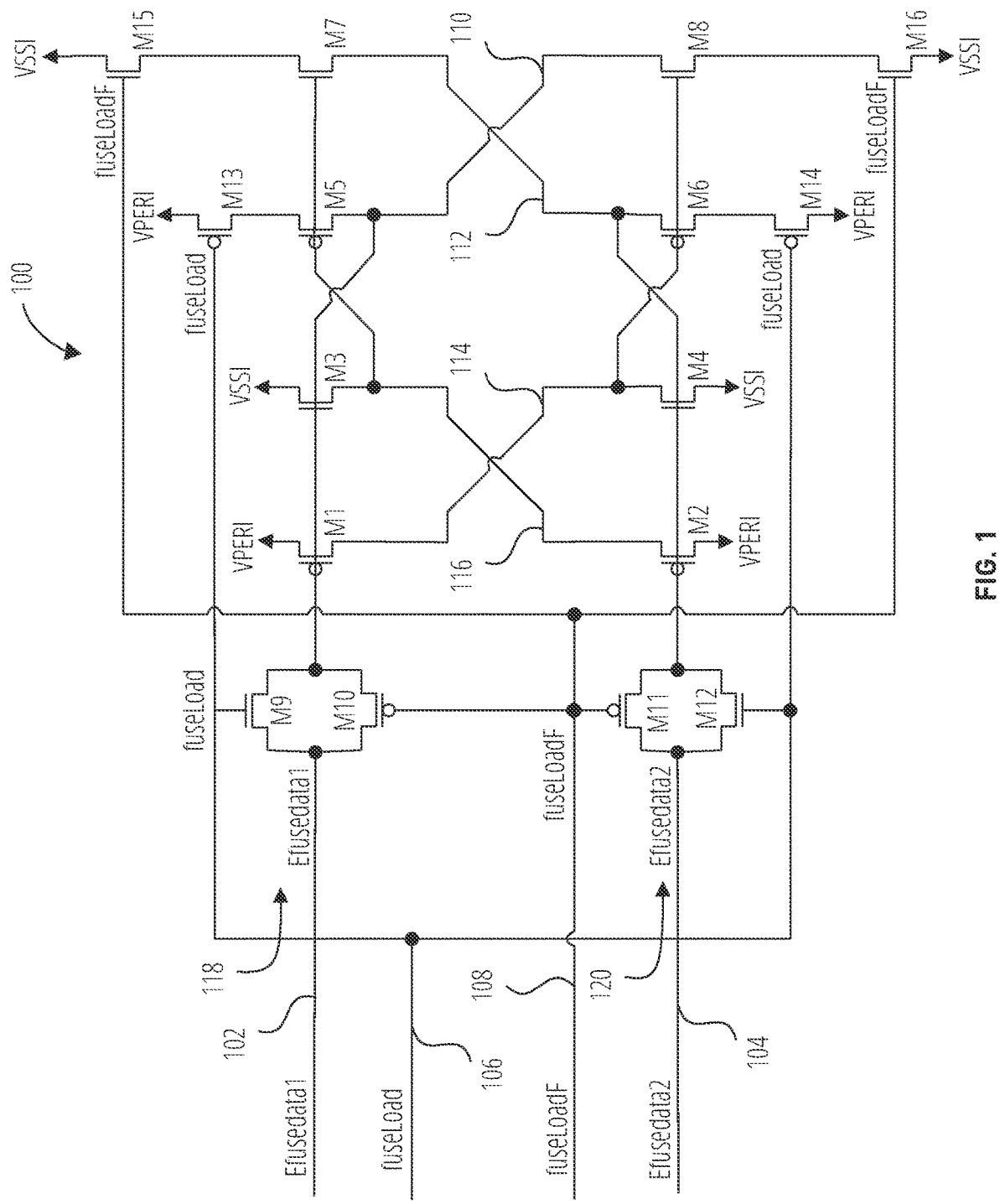
FIG. 1 is a circuit schematic illustration of a DICE latch circuit, according to some embodiments.

In the following detailed description, reference is made to the accompanying drawings, which form a part hereof, and in which are shown, by way of illustration, specific examples of embodiments in which the present disclosure may be practiced. These embodiments are described in sufficient detail to enable a person of ordinary skill in the art to practice the present disclosure. However, other embodiments enabled herein may be utilized, and structural, material, and process changes may be made without departing from the scope of the disclosure.

The illustrations presented herein are not meant to be actual views of any particular method, system, device, or structure, but are merely idealized representations that are employed to describe the embodiments of the present disclosure. In some instances similar structures or components in the various drawings may retain the same or similar numbering for the convenience of the reader; however, the similarity in numbering does not necessarily mean that the structures or components are identical in size, composition, configuration, or any other property.

The following description may include examples to help enable one of ordinary skill in the art to practice the disclosed embodiments. The use of the terms "exemplary," "by example," and "for example," means that the related description is explanatory, and though the scope of the disclosure is intended to encompass the examples and legal equivalents, the use of such terms is not intended to limit the scope of an embodiment or this disclosure to the specified components, steps, features, functions, or the like.

It will be readily understood that the components of the embodiments as generally described herein and illustrated in the drawings could be arranged and designed in a wide variety of different configurations. Thus, the following description of various embodiments is not intended to limit the scope of the present disclosure, but is merely representative of various embodiments. While the various aspects of the embodiments may be presented in the drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art will understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a digital signal processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to embodiments of the present disclosure.

The embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, other structure, or combinations thereof. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may include one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

As used herein, the term "semiconductor material" refers to a material having a conductivity between those of electrically insulating materials and electrically conductive materials. For example, a semiconductor material may have a conductivity of between about $10^{-8}$ Siemens per centimeter (S/cm) and $10^4$ S/cm at room temperature (e.g., substantially twenty degrees centigrade). Examples of semiconductor materials include element semiconductor materials found in column IV of the period table of elements such silicon (Si), germanium (Ge), and carbon (C). Other examples of semiconductor materials include compound semiconductor materials such as binary compound semiconductor materials (e.g., gallium arsenide (GaAs)), ternary compound semiconductor materials (e.g., $Al_xGa_{1-x}As$), and quaternary compound semiconductor materials (e.g., $Ga_xIn_{1-x}As_yP_{1-y}$), without limitation. Compound semiconductor materials may include combinations of elements from columns III and V of the periodic table of elements (III-V semiconductor materials) or from columns II and VI of the periodic table of elements (II-VI semiconductor materials), without limitation. Semiconductor devices often include crystalline semiconductor materials. By way of non-limiting examples, transistors and diodes include crystalline semiconductor materials. Accordingly, the term "semiconductor material," as used herein, refers specifically to crystalline semiconductor materials unless explicitly indicated otherwise herein.

As used herein, the term "intrinsic semiconductor material" refers to a semiconductor material having a relatively small density of impurities (e.g., a lower density of impurities than electron and hole densities resulting from thermal generation at room temperature).

As used herein, the term "doped semiconductor material" refers to a semiconductor material having a higher density of impurities introduced thereto than intrinsic semiconductor materials (e.g., a higher density of impurities than electron and hole densities resulting from thermal generation at room temperature). A doped semiconductor material may be doped predominantly with donor impurities such as phosphorus (P), antimony (Sb), bismuth (Bi), and arsenic (As), without limitation. Each donor impurity in a crystal lattice of semiconductor material adds a free electron, which increases the conductivity of the semiconductor material relative to the intrinsic form of the semiconductor material. Doped semiconductor materials that have been doped predominantly with donor impurities are referred to herein as "N-type semiconductor materials." A doped semiconductor material may instead be doped predominantly with trivalent or acceptor impurities such as boron (B), indium (In), aluminum (Al), and gallium (Ga), without limitation. Each trivalent or acceptor impurity in a crystal lattice of semiconductor material adds an electron hole (referred to herein as "hole"), which increases the conductivity of the semiconductor material relative to the intrinsic form of the semiconductor material. Doped semiconductor materials that have been doped predominantly with trivalent or acceptor impurities are referred to herein as "P-type semiconductor materials."

As used herein, the term "active material" refers to a semiconductor material that has been doped to function as a channel material in a metal oxide semiconductor (MOS) field effect transistor (FET) (MOSFET). A MOSFET transistor having a channel material that has been doped predominantly with donor impurities is referred to herein as an N-type MOS (NMOS) transistor because the active material serving as the channel material for the NMOS transistor includes N-type semiconductor material. Similarly, a MOSFET transistor having a channel material that has been doped predominantly with trivalent or acceptor impurities is referred to herein as a P-type MOS (PMOS) transistor because the active material serving as the channel material for the PMOS transistor includes P-type semiconductor material.

As used herein, the term "fuse" refers to a device that has a first electrical resistance in a default state and a second electrical resistance that is different from the first electrical resistance in a blown state. In some embodiments the first electrical resistance (default state) may be lower than the second electrical resistance (blown state). In some embodiments the first electrical resistance (default state) may be higher than the second electrical resistance (blown state), such as with an anti-fuse. One non-limiting example of a fuse is a MOSFET capacitor (MOSCap), which has a relatively high electrical resistance in its default state and a lower electrical resistance in its blown state. The different states of a fuse may be electrically set (e.g., by providing appropriate electrical signals to the fuse such as a fuse blowing voltage potential). Also, the different states (default state, blown state) of a fuse are electrically measurable because of the difference in electrical resistance between the different states, which may be measured by applying electrical signals (e.g., voltage potential biases, electrical current biases) and measuring a response of the fuse to the electrical signals. A latch circuit may be used to measure and actively store a response signal responsive to read potentials applied to a fuse. Accordingly, a fuse may be used to permanently store a bit of information by associating different logical levels (e.g., a "1" and a "0") to the different states (e.g., default and blown) of the fuse. An array or bank of fuses may be used to permanently store multiple bits of information.

Memory devices such as dynamic random access memory (DRAM) devices may use fuse banks to store bits that are pertinent to their operation. As one example, fuse banks may be used to store information indicating offsets of input buffers of a memory device, without limitation. As another example, fuse banks may be used to store addresses of memory cells that need to be repaired. Since fuses are used in DRAM devices to store bits that are pertinent to their operation, it may be beneficial to reduce failure in time (FIT) rates in reading fuses to avoid improper operation resulting from flipped bits.

A relatively low FIT may be helpful to reduce uncorrectable error correction code (UECC) errors in fuse latches of memory devices. For a fuse latch, FIT is proportional to an N+ area scale (i.e., channel area of transistors of the fuse circuit), and inversely proportional to a critical charge (Qcrit) scale of the fuse latch. Qcrit is an amount of charge required to flip a stored bit of the fuse latch. As used herein, the term "flip," when used with reference to a bit, refers to a transition from a first logic level voltage potential to a different logic level voltage potential (e.g., from a logic level high voltage potential to a logic level low voltage potential or vice versa). With transistor size reduction, the N+ area of transistors has decreased, which serves to reduce the FIT. Drivability of fuse latches, however, may be weakened responsive to the reduction in N+ area.

A latch circuit that may be used to read a data bit stored on a fuse includes a static random access memory (SRAM) latch. SRAM latches may occupy less chip area than D-type flipflop latches. As a result, SRAM latches may enable higher density fuse banks than D-type flipflop latches. SRAM latches and D-type flipflop latches, however, may be relatively vulnerable to single event upsets (SEUs, also known as "soft error upsets").

Another latch circuit that may be used to read a data bit stored on a fuse may include a dual interlocked storage cell (DICE) latch. DICE Latches have relatively good resistance to SEUs, which may cause a bit to flip. For example, due to the dual interlocked structure of DICE latches, DICE latches may be less vulnerable to SEUs than SRAM latches and D-type flipflop latches. Accordingly, DICE latches may be used to reduce the FIT as compared to SRAM latches and D-type flipflop latches.

Although DICE latches are less vulnerable to SEUs than SRAM latches and D-type flipflop latches due to their dual interlocked structure (two interlocked paths), the two interlocked paths share a same input node. As a result, if an input voltage potential at the input node of a DICE latch is struck by neutron energy and goes to a negative voltage potential or above power voltage level for a short time then both of the dual interlocked paths will be flipped and an output voltage potential of the DICE latch will be at the wrong logic level. In other words, the dual interlocked structure reduces the likelihood of a flipped bit due to an SEU except for at the input node of the DICE latch.

Disclosed herein are separate driver circuits (e.g., inverters) configured to drive input nodes of dual interlocked paths of latches (e.g., DICE latches). In the event of a flipped voltage potential at one of the input nodes associated with one of the dual interlocked paths due to an SEU, since the other dual interlocked path is not flipped the other dual interlocked path may still drive the final output node to the correct voltage potential level. By way of non-limiting example, an apparatus may include a DICE latch and two inverters with one inverter at an input node of each of the dual interlocked paths. Since the input nodes to the DICE latch are not shared, the apparatus is tolerant to one input error on one of the input nodes due to an SEU. By using two driver circuits (e.g., inverters) in conjunction with a DICE latch, SEU immunity may be significantly improved as compared to a DICE latch with input nodes sharing the same input because an SEU at one of the input nodes may be tolerated.

In some embodiments an apparatus includes a DICE latch circuit, a first driver circuit, and a second driver circuit. The DICE latch includes a first input node corresponding to a first path and a second input node corresponding to a second path. The first driver circuit is electrically connected to the first input node. The first driver circuit is configured to receive an input signal and drive a first input signal to the first input node responsive to the input signal. The second driver circuit is electrically connected to the second input node. The second driver circuit is configured to receive the input signal and drive a second input signal to the second input node responsive to the input signal.

In some embodiments a method of operating a DICE latch circuit includes asserting control signals of the DICE latch circuit to operate the DICE latch circuit in a read state and applying an input signal to inputs of a first driver circuit and a second driver circuit. The method also includes providing a first input signal to a first input node of the DICE latch circuit responsive to the input signal and providing a second input signal to a second input node of the DICE latch circuit responsive to the input signal. The first input node is electrically isolated from the second input node. The method further includes latching the first input signal and the second input signal to a first output node and a second output node, respectively, of the DICE latch circuit.

In some embodiments a computing system includes one or more processors and one or more memory devices electrically connected to the one or more processors. The one or more memory devices include a DICE latch circuit including a first input node and a second input node. The second input node is electrically isolated from the first input node.

FIG. 1 is a circuit schematic illustration of a DICE latch circuit 100, according to some embodiments. The DICE latch circuit 100 includes a first input node 102, a second input node 104, a first output node 110, a second output node 112, a first path 118 between the first input node 102 and the first output node 110, and a second path 120 between the second input node 104 and the second output node 112. The DICE latch circuit 100 also includes a first intermediate node 114 and a second intermediate node 116. The DICE latch circuit 100 further includes a first control node 106 and a second control node 108.

The DICE latch circuit 100 includes eight latching transistors M1-M8, four input isolation transistors M9-M12, and four power isolation transistors M13-M16. Input isolation transistors M9 (NMOS) and M10 (PMOS) are electrically connected in parallel to each other from the first input node 102 to the first output node 110. A gate of input isolation transistor M9 is electrically connected to the first control node 106 and a gate of input isolation transistor M10 is electrically connected to the second control node 108. Accordingly, input isolation transistors M9 and M10 are configured to isolate the first output node 110 from the first input node 102 responsive to a logic level low voltage potential (e.g., a "0," without limitation) of a first control signal fuseLoad on the first control node 106 and a logic level high voltage potential (e.g., a "1," without limitation) of a second control signal fuseLoadF on the second control node 108. Responsive to a logic level high voltage potential of the first control signal fuseLoad and/or a logic level low voltage potential of the second control signal fuseLoadF, however, the first input node 102 is electrically connected via one or more of input isolation transistors M9 and M10 to the first output node 110.

Similarly, input isolation transistors M11 (PMOS) and M12 (NMOS) are electrically connected in parallel to each other from the second input node 104 to the second output node 112. A gate of input isolation transistor M11 is electrically connected to the second control node 108 and a gate of input isolation transistor M12 is electrically connected to the first control node 106. Accordingly, input isolation transistors M11 and M12 are configured to isolate the second output node 112 from the second input node 104 responsive to a logic level high voltage potential of the second control signal fuseLoadF on the second control node 108 and a logic level low voltage potential of the second control signal fuseLoad on the first control node 106. Responsive to a logic level low voltage potential of the second control signal fuseLoadF on the second control node 108 and/or a logic level high voltage potential of the first control signal fuseLoad on the first control node 106, however, the second input node 104 is electrically connected via one or more of the input isolation transistors M11 and M12 to the second output node 112.

Latching transistor M1 (PMOS) is electrically connected between a logic level high node VPERI and the first intermediate node 114. The logic level high node VPERI is configured to receive a logic level high voltage potential VPERI. The term "VPERI" may be used interchangeably herein to refer to both the logic level high node and to the logic level high voltage potential the logic level high node is configured to receive, and the distinction will be clear based on the context of its use. A gate of latching transistor M1 is electrically connected to the first output node 110. As a result, responsive to a logic level high voltage potential of the first control signal fuseLoad and/or a logic level low voltage potential of the second control signal fuseLoadF, the gate of the latching transistor M1 is electrically connected to the first input node 102 and the first input signal Efusedata1. Responsive to a logic level low voltage potential of the first control signal fuseLoad and a logic level high voltage potential of the second control signal fuseLoadF, however, the gate of latching transistor M1 is electrically isolated from the first input node 102 and the corresponding first input signal Efusedata1. Responsive to a logic level low voltage potential of the first output node 110, latching transistor M1 is configured to electrically connect the logic level high node VPERI to the first intermediate node 114. Also, responsive to a logic level high voltage potential of the first output node 110, latching transistor M1 is configured to electrically isolate the first intermediate node 114 from the logic level high node VPERI.

Latching transistor M2 (PMOS) is electrically connected between logic level high node VPERI and the second intermediate node 116. A gate of latching transistor M2 is electrically connected to the second output node 112. As a result, responsive to a logic level high voltage potential of the first control signal fuseLoad and/or a logic level low voltage potential of the second control signal fuseLoadF, the gate of the latching transistor M2 is electrically connected to the second input node 104 and the second input signal Efusedata2. Responsive to a logic level low voltage potential of the first control signal fuseLoad and a logic level high voltage potential of the second control signal fuseLoadF, however, the gate of latching transistor M2 is electrically isolated from the second input node 104 and the corresponding second input signal Efusedata2. Responsive to a logic level low voltage potential of the second output node 112, latching transistor M2 is configured to electrically connect the logic level high node VPERI to the second intermediate node 116. Also, responsive to a logic level high voltage potential of the second output node 112, latching transistor M2 is configured to electrically isolate the second intermediate node 116 from the logic level high node VPERI.

Latching transistor M3 (NMOS) is electrically connected between a logic level low node VSSI and the second intermediate node 116. The logic level low node VSSI is configured to receive a logic level low voltage potential VSSI. The term "VSSI" may be used interchangeably herein to refer to both the logic level low node and to the logic level low voltage potential the logic level low node is configured to receive, and the distinction will be clear based on the context of its use. A gate of latching transistor M3 is electrically connected to the first output node 110. As a result, responsive to a logic level high voltage potential of the first control signal fuseLoad and/or a logic level low voltage potential of the second control signal fuseLoadF, the gate of the latching transistor M1 is electrically connected to the first input node 102 and the first input signal Efusedata1. Responsive to a logic level low voltage potential of the first control signal fuseLoad and a logic level high voltage potential of the second control signal fuseLoadF, however, the gate of latching transistor M3 is electrically isolated from the first input node 102 and the corresponding first input signal Efusedata1. Responsive to a logic level high voltage potential of the first output node 110, latching transistor M3 is configured to electrically connect the logic level low node VSSI to the second intermediate node 116. Also, responsive to a logic level low voltage potential of the first output node 110, latching transistor M3 is configured to electrically isolate the second intermediate node 116 from the logic level low node VSSI.

Latching transistor M4 (NMOS) is electrically connected between logic level low node VSSI and the first intermediate node 114. A gate of latching transistor M4 is electrically connected to the second output node 112. As a result, responsive to a logic level high voltage potential of the first control signal fuseLoad and/or a logic level low voltage potential of the second control signal fuseLoadF, the gate of the latching transistor M4 is electrically connected to the second input node 104 and the second input signal Efusedata2. Responsive to a logic level low voltage potential of the first control signal fuseLoad and a logic level high voltage potential of the second control signal fuseLoadF, however, the gate of latching transistor M4 is electrically isolated from the second input node 104 and the corresponding second input signal Efusedata2. Responsive to a logic level high voltage potential of the second output node 112, latching transistor M4 is configured to electrically connect the logic level low node VSSI to the first intermediate node 114. Also, responsive to a logic level low voltage potential of the second output node 112, latching transistor M3 is configured to electrically isolate the first intermediate node 114 from the logic level low node VSSI.

Latching transistor M5 (PMOS) is electrically connected between power isolation transistor M13 and first output node 110. A gate of latching transistor M5 is electrically connected to second intermediate node 116. Responsive to a logic level low voltage potential of the second intermediate node 116, latching transistor M5 is configured to electrically connect power isolation transistor M13 to the first output node 110. Also, responsive to a logic level high voltage potential of the second intermediate node 116, latching transistor M5 is configured to electrically isolate the first output node 110 from power isolation transistor M13.

Latching transistor M6 (PMOS) is electrically connected between power isolation transistor M14 and second output node 112. A gate of latching transistor M6 is electrically connected to first intermediate node 114. Responsive to a logic level low voltage potential of the first intermediate node 114, latching transistor M6 is configured to electrically connect power isolation transistor M14 to the second output node 112. Also, responsive to a logic level high voltage potential of the first intermediate node 114, latching transistor M6 is configured to electrically isolate the second output node 112 from power isolation transistor M14.

Latching transistor M7 (NMOS) is electrically connected between power isolation transistor M15 and second output node 112. A gate of latching transistor M7 is electrically connected to second intermediate node 116. Responsive to a logic level high voltage potential of the second intermediate node 116, latching transistor M7 is configured to electrically connect power isolation transistor M15 to the second output node 112. Also, responsive to a logic level low voltage potential of the second intermediate node 116, latching transistor M7 is configured to electrically isolate the second output node 112 from power isolation transistor M15.

Latching transistor M8 (NMOS) is electrically connected between power isolation transistor M16 and first output node 110. A gate of latching transistor M8 is electrically connected to first intermediate node 114. Responsive to a logic level high voltage potential of the first intermediate node 114, latching transistor M8 is configured to electrically connect power isolation transistor M16 to the first output node 110. Also, responsive to a logic level low voltage potential of the first intermediate node 114, latching transistor M8 is configured to electrically isolate the first output node 110 from power isolation transistor M16.

Power isolation transistor M13 (PMOS) is electrically connected between logic level high node VPERI and latching transistor M5. A gate of power isolation transistor M13 is electrically connected to the first control node 106. Responsive to a logic level low voltage potential of first control signal fuseLoad on the first control node 106, power isolation transistor M13 is configured to electrically connect the logic level high node VPERI to latching transistor M5. Also, responsive to a logic level high voltage potential of first control signal fuseLoad on the first control node 106, power isolation transistor M13 is configured to electrically isolate the logic level high node VPERI from latching transistor M5.

Power isolation transistor M14 (PMOS) is electrically connected between logic level high node VPERI and latching transistor M6. A gate of power isolation transistor M14 is electrically connected to the first control node 106. Responsive to a logic level low voltage potential of first control signal fuseLoad on the first control node 106, power isolation transistor M14 is configured to electrically connect the logic level high node VPERI to latching transistor M6. Also, responsive to a logic level high voltage potential of first control signal fuseLoad on the first control node 106, power isolation transistor M14 is configured to electrically isolate the logic level high node VPERI from latching transistor M6.

Power isolation transistor M15 (NMOS) is electrically connected between logic level low node VSSI and latching transistor M7. A gate of power isolation transistor M15 is electrically connected to the second control node 108. Responsive to a logic level high voltage potential of second control signal fuseLoadF on the second control node 108, power isolation transistor M15 is configured to electrically connect the logic level low node VSSI to latching transistor M7. Also, responsive to a logic level low voltage potential of second control signal fuseLoadF on the second control node 108, power isolation transistor M15 is configured to electrically isolate the logic level low node VSSI from latching transistor M7.

Power isolation transistor M16 (NMOS) is electrically connected between logic level low node VSSI and latching transistor M8. A gate of power isolation transistor M16 is electrically connected to the second control node 108. Responsive to a logic level high voltage potential of second control signal fuseLoadF on the second control node 108, power isolation transistor M16 is configured to electrically connect the logic level low node VSSI to latching transistor M8. Also, responsive to a logic level low voltage potential of second control signal fuseLoadF on the second control node 108, power isolation transistor M16 is configured to electrically isolate the logic level low node VSSI from latching transistor M8.

In a read operation the DICE latch circuit 100 may operate in a read state. In the read state the first control signal fuseLoad is set at a logic level high voltage potential and the second control signal fuseLoadF is set at a logic level low voltage potential to electrically connect the first input node 102 to the first output node 110 and the second input node 104 to the second output node 112. The first control signal fuseLoad may be complementary to the second control signal fuseLoad (e.g., an inverter may be electrically connected between first control node 106 and second control node 108). Accordingly, when the first control signal fuseLoad is at a logic level high voltage potential the second control signal fuseLoadF is at a logic level low voltage potential. With the first control signal fuseLoad is set at a logic level high voltage potential and the second control signal fuseLoadF is set at a logic level low voltage potential, the power isolation transistors M13-M16 electrically isolate latching transistors M5-M8 from logic level high node VPERI and logic level low node VSSI.

With the first input node 102 electrically connected to the first output node 110, the second input node 104 electrically connected to the second output node 112, and the latching transistors M5-M8 electrically isolated from logic level high node VPERI and logic level low node VSSI in the read state, the first output node 110 and the second output node 112 are ready to receive the first input signal Efusedata1 and the second input signal Efusedata2, respectively. Accordingly, the first output node 110 and the second output node 112 may be set to whichever logic level the first input signal Efusedata1 and the second input signal Efusedata2 are set to.

By way of non-limiting example, if during the read state the first input signal Efusedata1 and the second input signal Efusedata2 are set to a logic level high voltage potential, the first output node 110 and the second output node 112 will also be set to the logic level high voltage potential. A logic level high voltage potential on the first output node 110 and the second output node 112 may cause latching transistors M3 and M4 to electrically conduct and latching transistors M1 and M2 to electrically insolate. Accordingly, latching transistors M3 and M4 may latch a logic level low voltage potential to first intermediate node 114 and second intermediate node 116 because latching transistors M3 and M4 may electrically connect the logic level low node VSSI to the first intermediate node 114 and the second intermediate node 116.

If during the read state, however, the first input signal Efusedata1 and the second input signal Efusedata2 are set to a logic level low voltage potential, the first output node 110 and the second output node 112 will also be set to the logic level low voltage potential. A logic level low voltage potential on the first output node 110 and the second output node 112 may cause latching transistors M1 and M2 to electrically conduct and latching transistors M3 and M4 to electrically insolate. Accordingly, latching transistors M1 and M2 may latch a logic level high voltage potential to first intermediate node 114 and second intermediate node 116 because latching transistors M1 and M2 may electrically connect the logic level high node VPERI to the first intermediate node 114 and the second intermediate node 116.

With the first output node 110, the second output node 112, the first intermediate node 114, and the second intermediate node 116 set at logic levels responsive to the first input signal and the second input signal, these logic levels may be stored to the first output node 110, the second output node 112, the first intermediate node 114, and the second intermediate node 116 by transitioning from the read state to a storage state of the DICE latch circuit 100 (e.g., transitioning from a read operation to a storage operation). To transition from the read state to the storage state the first control signal fuseLoad may be set to a logic level low voltage potential and the second control signal fuseLoadF may be set to a logic level high voltage potential. In response, the input isolation transistors M9-M10 may electrically isolate the first input node 102 from the first output node 110 and the second input node 104 from the second output node 112. Also, the power isolation transistors M13-M16 may electrically connect latching transistors M5 and M6 to the logic level high node VPERI and latching transistors M7 and M8 to the logic level low node VSSI.

With latching transistors M5 and M6 electrically connected to the logic level high node VPERI and latching transistors M7 and M8 electrically connected to the logic level low node VSSI in the storage state, the first output node 110 and the second output node 112 will be held at whatever logic level they were set to during the read state. For example, if the first output node 110 and the second output node 112 were set to a logic level high voltage potential during the read operation, second intermediate node 116 and first intermediate node 114 will be at a logic level low voltage potential, as previously discussed. Since gates of latching transistors M5 and M7 are electrically connected to second intermediate node 116 and gates of latching transistors M6 and M8 are electrically connected to first intermediate node 114, latching transistors M5 and M6 electrically connect first output node 110 and second output node 112 to the logic level high node VPERI (via power isolation transistors M13 and M14, respectively). This in turn drives latching transistors M3 and M4 to maintain electrical connection between the logic level low node VSSI and first intermediate node 114 and second intermediate node 116.

Accordingly, first intermediate node 114 and second intermediate node 116 are held at a logic level low voltage potential.

If, on the other hand, the first output node 110 and the second output node 112 were set to a logic level low voltage potential during the read operation, second intermediate node 116 and first intermediate node 114 will be at a logic level high voltage potential, as previously discussed. Since gates of latching transistors M5 and M7 are electrically connected to second intermediate node 116 and gates of latching transistors M6 and M8 are electrically connected to first intermediate node 114, latching transistors M7 and M8 electrically connect first output node 110 and second output node 112 to the logic level low node VSSI (via power isolation transistors M15 and M16, respectively). This in turn drives latching transistors M1 and M2 to maintain electrical connection between the logic level high node VPERI and first intermediate node 114 and second intermediate node 116. Accordingly, first intermediate node 114 and second intermediate node 116 are held at a logic level high voltage potential.

With appropriate logic levels stored to the first output node 110, the second output node 112, the first intermediate node 114, and the second intermediate node 116 during the storage state, the DICE latch circuit 100 may be read be sensing the logic level voltage potential at any one or more of the first output node 110, the second output node 112, the first intermediate node 114, and the second intermediate node 116. For example, during the storage state if the first output node 110 and/or the second output node 112 is at a logic level high voltage potential, it may be determined that the first input signal Efusedata1 and the second input signal Efusedata2 were at a logic level high voltage potential when the DICE latch circuit 100 transitioned from the read state to the storage state. The same conclusion may be determined if during the storage state the first intermediate node 114 and/or the second intermediate node 116 is at a logic level low voltage potential. If, on the other hand, the first output node 110 and/or the second output node 112 is at a logic level low voltage potential, it may be determined that the first input signal Efusedata1 and the second input signal Efusedata2 were at a logic level low voltage potential when the DICE latch circuit 100 transitioned from the read state to the storage state. The same conclusion may be determined if during the storage state the first intermediate node 114 and/or the second intermediate node 116 is at a logic level high voltage potential.

The first input node 102 corresponds to the first path 118 and the second input node 104 corresponds to the second path 120. The first path 118 and the second path 120 are interlocked. As a result, the DICE latch circuit 100 may be resilient to an SEU on one of the first path 118 and the second path 120 (e.g., an SEU at any one of the first output node 110, the second output node 112, the first intermediate node 114, and the second intermediate node 116) because the other of the first path 118 and the second path 120 may drive the first output node 110 and the second output node 112 to the proper logic level.

In addition, the first input node 102 is electrically isolated from the second input node 104. Accordingly, an SEU at any one of the first input node 102 or the second input node during the read state may be corrected by driving of one of the first path 118 and second path 120 that corresponds to the other one of the first input node 102 and the second input node 104 (i.e., the path that does not experience the SEU). Accordingly, the DICE latch circuit 100 may be more resilient to SEUs at the first input node 102 and the second input node 104 than a similar DICE latch circuit having its input nodes electrically connected together. In the case of a DICE latch circuit having its input nodes electrically connected together the bit stored to the DICE latch circuit may flip if multiplexers cause a short between the first output node 110 and the second output node 112 during a UECC (especially in the event of a fast corner with a weak driver). The DICE latch circuit 100 may be resilient to this issue because the first input node 102 is electrically isolated from the second input node 104.

Figure 2:
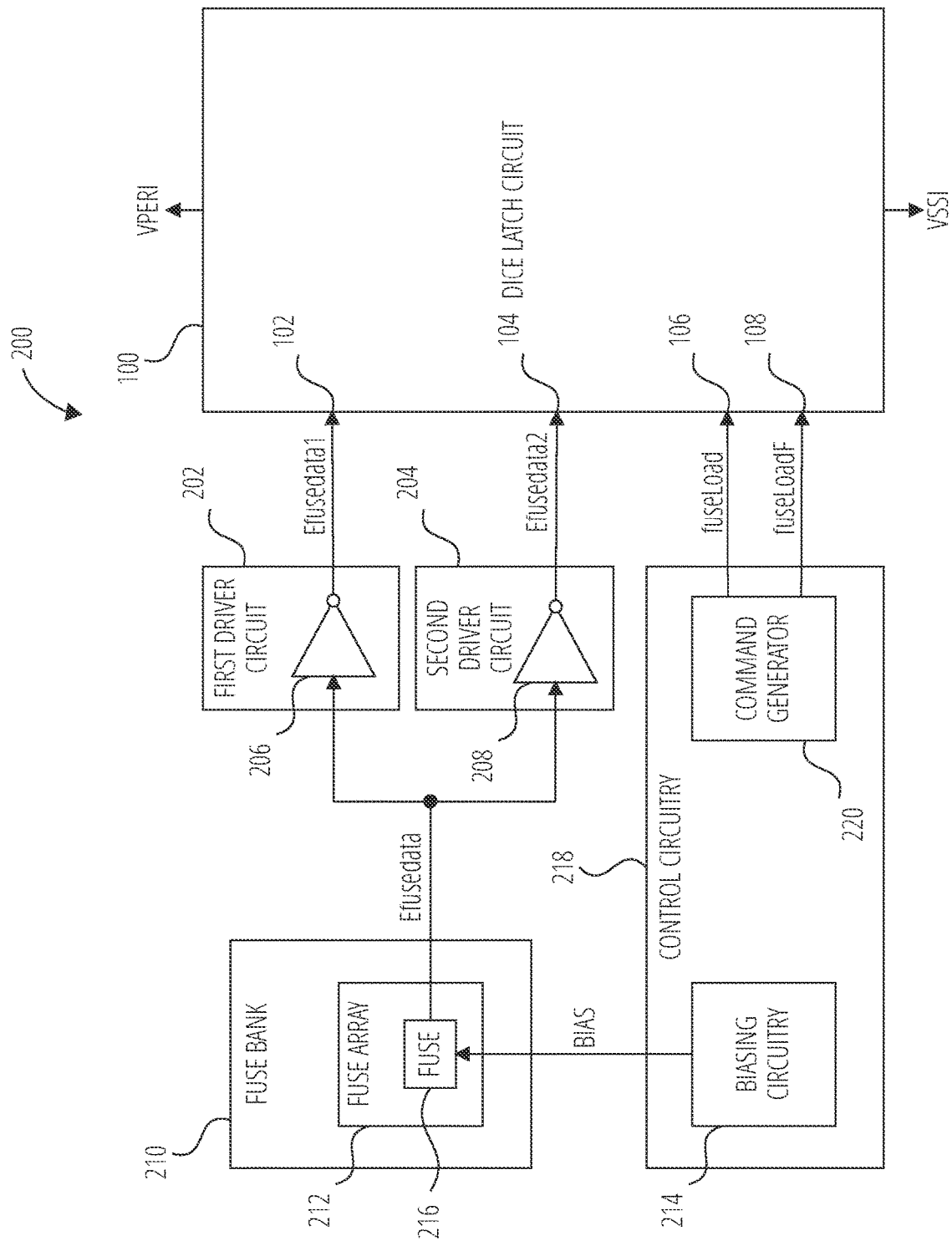
FIG. 2 is a block diagram of a memory system, according to some embodiments.

FIG. 2 is a block diagram of a memory system 200, according to some embodiments. The memory system 200 includes the DICE latch circuit 100 of FIG. 1, a first driver circuit 202, and a second driver circuit 204. As previously discussed, the DICE latch circuit 100 includes a first input node 102 corresponding to a first path 118 and a second input node 104 corresponding to a second path 120. The first driver circuit 202 is electrically connected to the first input node 102. The first driver circuit 202 is configured to receive an input signal Efusedata and drive a first input signal Efusedata1 to the first input node 102 responsive to the input signal Efusedata. The second driver circuit 204 is electrically connected to the second input node 104. The second driver circuit 204 is configured to receive the input signal Efusedata and drive a second input signal Efusedata2 to the second input node 104 responsive to the input signal Efusedata.

The first driver circuit 202 and the second driver circuit 204 are configured to maintain the first input node 102 and the second input node 104 electrically isolated from each other. In some embodiments the first driver circuit 202 may include a first inverter circuit 206 and the second driver circuit 204 may include a second inverter circuit 208. By way of non-limiting example, the first inverter circuit 206 and the second inverter circuit 208 may include complementary metal oxide semiconductor (CMOS) inverters. Although not shown, the first driver circuit 202 and/or the second driver circuit 204 may instead include a digital buffer circuit, or other circuit capable of electrically isolating the first input node 102 from the second input node 104. With the first input node 102 electrically isolated from the second input node 104 (e.g., by first driver circuit 202 and second driver circuit 204), the DICE latch circuit 100 may be resilient to SEUs at the first input node 102 and the second input node 104.

The memory system 200 also includes a fuse bank 210 including a fuse array 212, which in turn includes fuses including fuse 216. The DICE latch circuit 100 is configured to store a bit of information stored to the fuse 216 (e.g., by leaving the fuse 216 unblown or by blowing the fuse 216). The fuses (e.g., fuse 216) of the fuse array 212 may be configured to store bits of information that is pertinent to operation of the memory system 200. By way of non-limiting example, the fuse array 212 may be configured to store information indicating offsets of input buffers (not shown) of the memory system 200. As another non-limiting example, the fuse array 212 may be configured to store information regarding addresses of memory cells (not shown) that need to be repaired.

The memory system 200 further includes control circuitry 218. The control circuitry 218 includes a command generator 220 configured to provide a first control signal fuseLoad to a first control node 106 of the DICE latch circuit 100 and a second control signal fuseLoadF to a second control node 108 of the DICE latch circuit 100. Accordingly, the command generator 220 is configured to control an operational state of the DICE latch circuit 100 (e.g., a read state, a storage state) by providing appropriate logic levels to the first control node 106 and the second control node 108 using the first control signal fuseLoad and the second control signal fuseLoadF, respectively, as discussed with reference to FIG. 1.

The control circuitry 218 also includes biasing circuitry 214 configured to provide bias voltage potentials to the fuses of the fuse array 212. For example, the biasing circuitry 214 is configured to provide a bias signal BIAS (e.g., a read voltage potential, a read current, without limitation) to the fuse 216 to generate the input signal Efusedata. The input signal Efusedata may be substantially a logic level high voltage potential responsive to the fuse 216 being in a first state (e.g., one of a blown state and an unblown state). The input signal Efusedata may be substantially a logic level low voltage potential responsive to the fuse 216 being in a second state (e.g., the other of the blown state and the unblown state). The fuse 216 is configured to provide the input signal Efusedata to inputs of the first driver circuit 202 and the second driver circuit 204.

In operation the command generator 220 may control logic levels of the first control signal fuseLoad and the second control signal fuseLoadF to operate the DICE latch circuit 100 in the read state. The biasing circuitry 214 may provide a bias signal BIAS to the fuse 216 to read the state of the fuse 216, and the fuse 216 may provide the input signal Efusedata to the inputs of the first driver circuit 202 and the second driver circuit 204. The first driver circuit 202 and the second driver circuit 204 may provide the first input signal Efusedata1 to the first input node 102 and the second input signal Efusedata2 to the second input node 104 responsive to the input signal Efusedata. The DICE latch circuit 100 may set the first output node 110 (FIG. 1) and the second output node 112 (FIG. 1) to the same logic level as the first input signal Efusedata1 and the second input signal Efusedata2 (e.g., complementary to the logic level of the input signal Efusedata in embodiments where the first driver circuit 202 and the second driver circuit 204 include first inverter circuit 206 and second inverter circuit 208, respectively). The DICE latch circuit 100 may also drive the first intermediate node 114 (FIG. 1) and the second intermediate node 116 (FIG. 1) to a complementary logic level as that set to the first output node 110 and the second output node 112, as discussed with reference to FIG. 1. The command generator 220 may then transfer the DICE latch circuit 100 from the read state to the storage state by setting the first control signal fuseLoad and the second control signal fuseLoadF to appropriate logic levels, as discussed with reference to FIG. 1. As a result, the DICE latch circuit 100 may, in the storage state, store the logic levels set to the first output node 110, the second output node 112, the first intermediate node 114, and the second intermediate node 116 (FIG. 1) during the read state.

Figure 3:
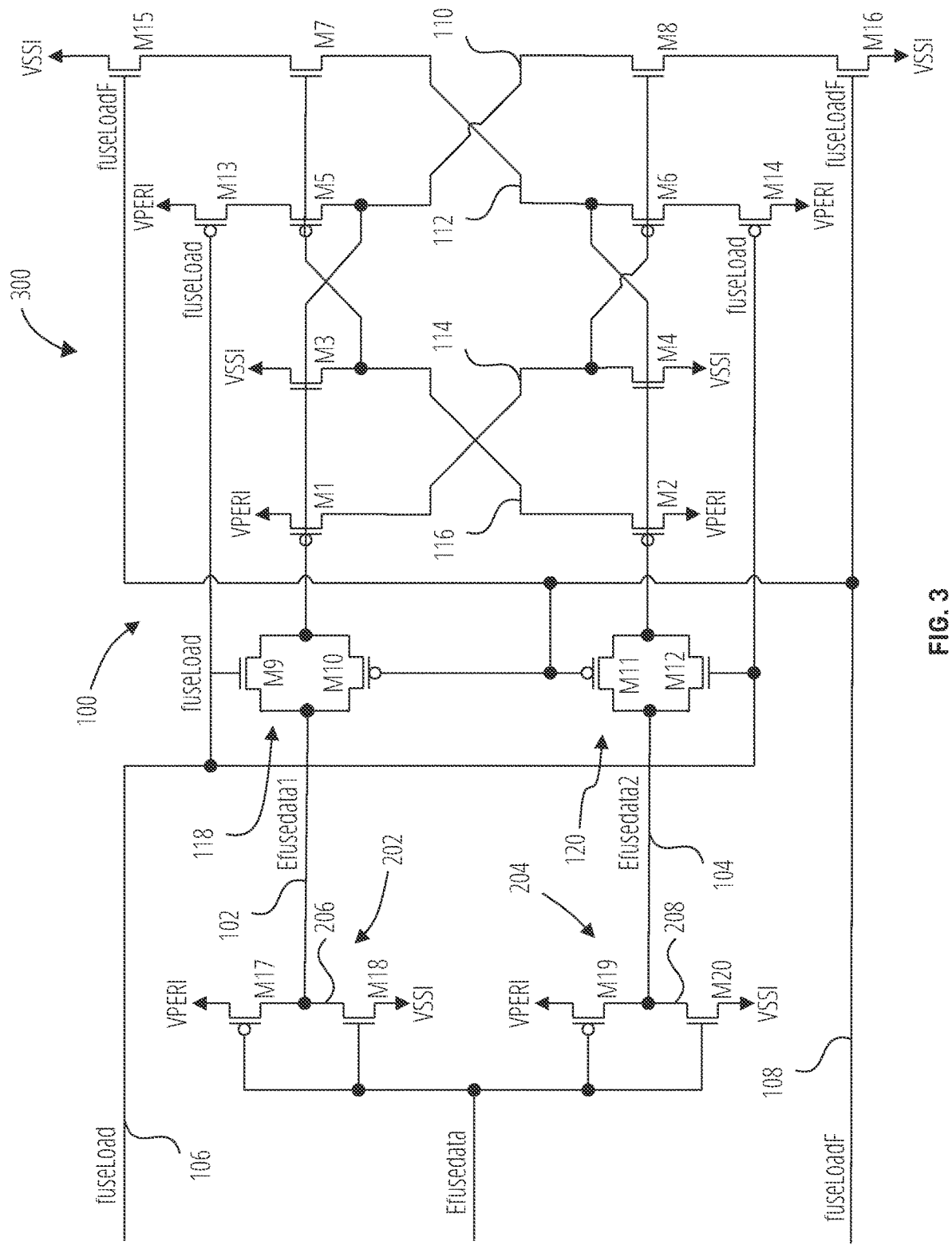
FIG. 3 is a circuit schematic illustration of a portion of the memory system of FIG. 2, according to some embodiments.

FIG. 3 is a circuit schematic illustration of a portion 300 of the memory system 200 of FIG. 2, according to some embodiments. The portion 300 includes the DICE latch circuit 100 discussed above in detail with reference to FIG. 1, and like reference numerals signal labels, and component labels are therefore not here discussed to avoid redundancy of the disclosure.

The portion 300 also includes the first driver circuit 202 and the second driver circuit 204 discussed above with reference to FIG. 2. As previously discussed, the first driver circuit 202 may include a first inverter circuit 206 and the second driver circuit 204 may include a second inverter circuit 208. The first inverter circuit 206 and the second inverter circuit 208 include CMOS inverters. More specifically, first inverter circuit 206 includes a pull-up transistor M17 (PMOS) and a pull-down transistor M18 (NMOS) electrically connected in series between the logic level high node VPERI and the logic level low node VSSI. Also, second inverter circuit 208 includes a pull-up transistor M19 (PMOS) and a pull-down transistor M20 (NMOS) electrically connected in series between the logic level high node VPERI and the logic level low node VSSI.

Gates of the pull-up transistors M17 and M19 and the pull-down transistors M18 and M20 are configured to receive the input signal Efusedata. In response to the input signal Efusedata, the first inverter circuit 206 and the second inverter circuit 208 are configured to invert the input signal Efusedata to generate the first input signal Efusedata1 and the second input signal Efusedata2, respectively.

Figure 4:
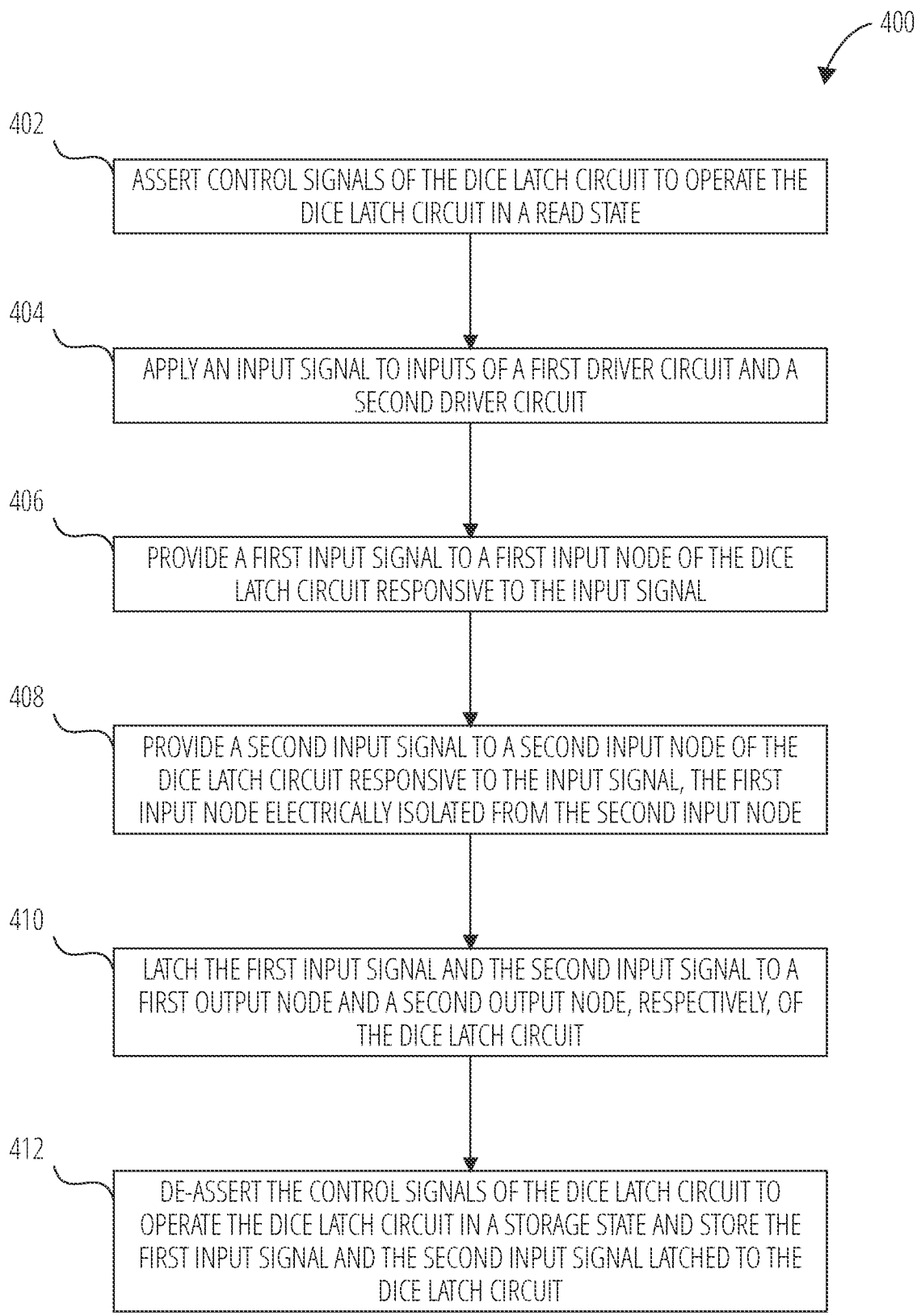
FIG. 4 is a flowchart illustrating a method of operating a DICE latch circuit, according to some embodiments.

FIG. 4 is a flowchart illustrating a method 400 of operating a DICE latch circuit (e.g., the DICE latch circuit 100 of FIG. 1, FIG. 2, and FIG. 3), according to some embodiments. At operation 402 method 400 includes asserting control signals (e.g., the first control signal fuseLoad and the second control signal fuseLoadF of FIG. 1, FIG. 2, and FIG. 3, without limitation) of the DICE latch circuit to operate the DICE latch circuit in a read state. By way of non-limiting example, in the DICE latch circuit 100 of FIG. 1, FIG. 2, and FIG. 3, asserting the control signals to operate the DICE latch circuit in the read state includes setting a first control signal fuseLoad to a logic level high voltage potential and a second control signal fuseLoadF to a logic level low voltage potential, electrically connecting the first input node 102 to the first output node 110 and the second input node 104 to the second output node 112.

At operation 404 method 400 includes applying an input signal (e.g., input signal Efusedata of FIG. 2 and FIG. 3) to inputs of a first driver circuit (e.g., the first driver circuit 202 of FIG. 1 and FIG. 2) and a second driver circuit (e.g., the second driver circuit 204 of FIG. 1 and FIG. 2). In some embodiments applying (operation 404) the input signal to the inputs of the first driver circuit and the second driver circuit comprises applying the input signal to inputs of a first inverter circuit (e.g., first inverter circuit 206 of FIG. 2 and FIG. 3) and a second inverter circuit (e.g., the second inverter circuit 208 of FIG. 2 and FIG. 3).

At operation 406 method 400 includes providing a first input signal (e.g., first input signal Efusedata1 of FIG. 1, FIG. 2, and FIG. 3) to a first input node (e.g., first input node 102 of FIG. 1) of the DICE latch circuit responsive to the input signal. In some embodiments providing (operation 406) the first input signal to the first input node of the DICE latch circuit includes inverting the input signal to provide the first input signal.

At operation 408 method 400 includes providing a second input signal (e.g., second input signal Efusedata2 of FIG. 1, FIG. 2, and FIG. 3) to a second input node of the DICE latch circuit responsive to the input signal, the first input node electrically isolated from the second input node. In some embodiments providing (operation 408) the second input signal to the second input node of the DICE latch circuit includes inverting the input signal to provide the second input signal. In some embodiments applying (operation 406 and operation 408) the input signal to the inputs of the first driver circuit and the second driver circuit comprises providing a fuse signal to the inputs responsive to a bias signal (e.g., bias signal BIAS of FIG. 2) applied to a fuse (e.g., fuse 216 of FIG. 2).

At operation 410 method 400 includes latching the first input signal and the second input signal to a first output node and a second output node, respectively, of the DICE latch circuit.

At operation 412 method 400 includes de-asserting the control signals of the DICE latch circuit to operate the DICE latch circuit in a storage state and storing the first input signal and the second input signal latched to the DICE latch circuit. By way of non-limiting example, in the DICE latch circuit 100 of FIG. 1, FIG. 2, and FIG. 3, de-asserting the control signals to operate the DICE latch circuit in the storage state includes setting a first control signal fuseLoad to a logic level high voltage potential and a second control signal fuseLoadF to a logic level low voltage potential, electrically isolating the first input node 102 to the first output node 110 and the second input node 104 to the second output node 112, and electrically connecting logic level high node VPERI to latching transistors M13 and M14 and logic level low node VSSI to latching transistors M7 and M8.

In some embodiments asserting (operation 402) control signals of the DICE latch circuit includes asserting gates of isolation transistors (e.g., isolation transistors M9-M12 of FIG. 1 and FIG. 3) configured to electrically conduct the first input signal and the second input signal into the DICE latch circuit responsive to assertions (operation 402) of the control signals and electrically isolate the DICE latch circuit from the first input signal and the second input signal responsive to de-assertions (operation 412) of the control signals.

Figure 5:
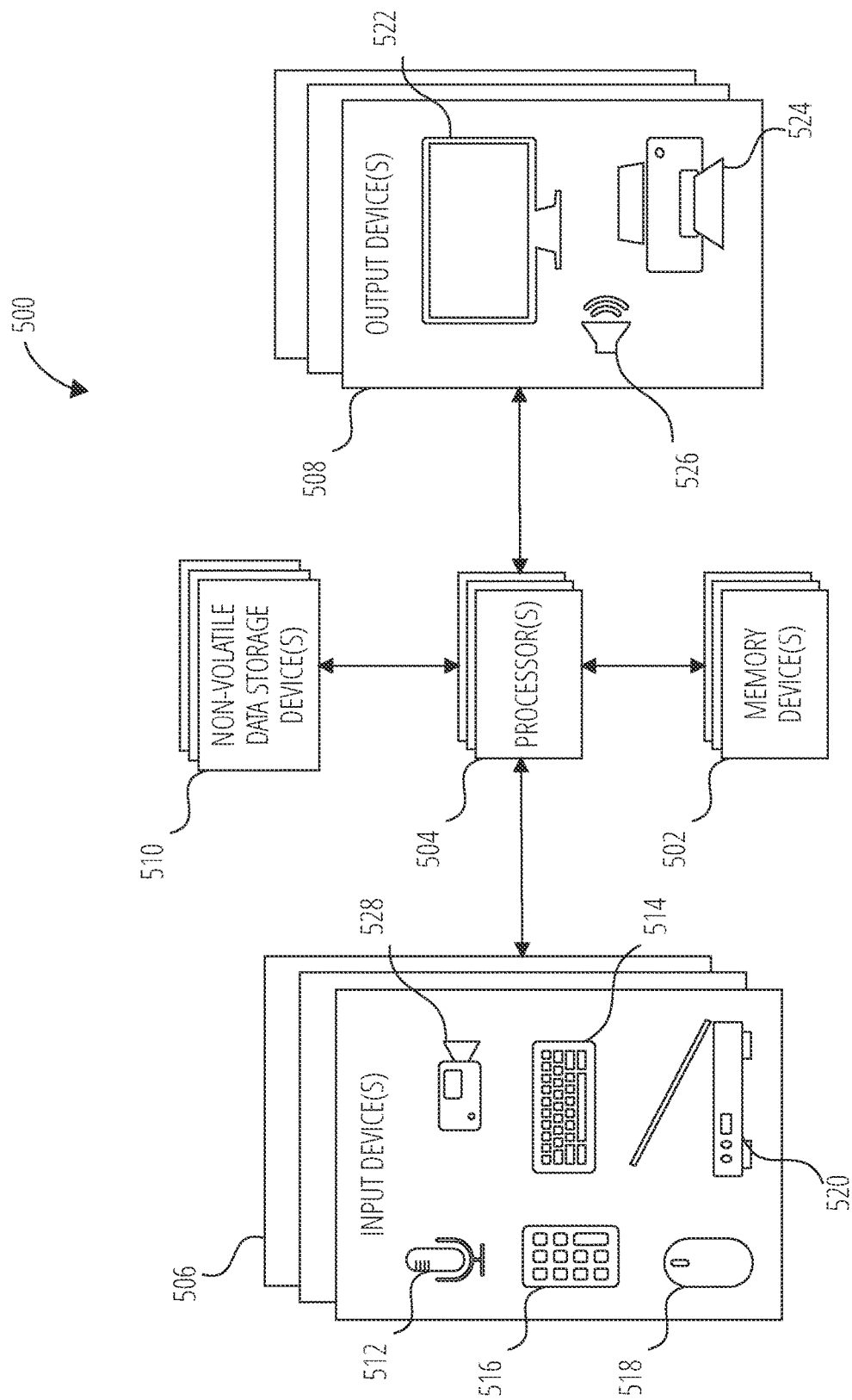
FIG. 5 is a block diagram of a computing system, according to some embodiments.

FIG. 5 is a block diagram of a computing system 500, according to some embodiments. The computing system 500 includes one or more processors 504 operably coupled to one or more memory devices 502, one or more non-volatile data storage devices 510, one or more input devices 506, and one or more output devices 508. In some embodiments the computing system 500 includes a personal computer (PC) such as a desktop computer, a laptop computer, a tablet computer, a mobile computer (e.g., a smartphone, a personal digital assistant (PDA), etc.), a network server, or other computer device.

In some embodiments the one or more processors 504 may include a central processing unit (CPU) or other processor configured to control the computing system 500. In some embodiments the one or more memory devices 502 include random access memory (RAM), such as volatile data storage (e.g., dynamic RAM (DRAM) static RAM (SRAM), etc.). In some embodiments the one or more non-volatile data storage devices 510 include a hard drive, a solid state drive, Flash memory, erasable programmable read only memory (EPROM), other non-volatile data storage devices, or any combination thereof. In some embodiments the one or more input devices 506 include a keyboard 514, a pointing device 518 (e.g., a mouse, a track pad, etc.), a microphone 512, a keypad 516, a scanner 520, a camera 528, other input devices, or any combination thereof. In some embodiments the output devices 508 include an electronic display 522, a speaker 526, a printer 524, other output devices, or any combination thereof.

The one or more memory devices 502 include the memory system 200 of FIG. 2. Accordingly, the one or more memory devices 502 include a DICE latch circuit (e.g., the DICE latch circuit 100 of FIG. 1) including a first input node (e.g., the first input node 102 of FIG. 1) and a second input node (e.g., the second input node 104 of FIG. 1). The second input node is electrically isolated from the first input node. In some embodiments the one or more memory devices 502 may further include a first driver circuit (e.g., the first driver circuit 202 of FIG. 2 and FIG. 3) electrically connected to the first input node and a second driver circuit (e.g., the second driver circuit 204 of FIG. 2 and FIG. 3) electrically connected to the second input node. In some embodiments the first driver circuit includes a first inverter circuit (e.g., the first inverter circuit 206 of FIG. 2 and FIG. 3) and the second driver circuit includes a second inverter circuit (e.g., the second inverter circuit 208 of FIG. 2 and FIG. 3). In some embodiments at least one of the first inverter circuit and the second inverter circuit includes a CMOS inverter. In some embodiments the first driver circuit includes a first digital buffer and the second driver circuit includes a second digital buffer.

In some embodiments the one or more memory devices 502 further include a fuse bank (e.g., the fuse bank 210 of FIG. 2) including a fuse (e.g., the fuse 216 of FIG. 2). In some embodiments the DICE latch circuit is configured to read and store a bit of data stored to the fuse.

As used in the present disclosure, the terms "module" or "component" may refer to specific hardware implementations configured to perform the actions of the module or component and/or software objects or software routines that may be stored on and/or executed by general purpose hardware (e.g., computer-readable media, processing devices, etc.) of the computing system. In some embodiments, the different components, modules, engines, and services described in the present disclosure may be implemented as objects or processes that execute on the computing system (e.g., as separate threads). While some of the system and methods described in the present disclosure are generally described as being implemented in software (stored on and/or executed by general purpose hardware), specific hardware implementations or a combination of software and specific hardware implementations are also possible and contemplated.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims) are generally intended as "open" terms (e.g., the term "including" should be interpreted as "including, but not limited to," the term "having" should be interpreted as "having at least," the term "includes" should be interpreted as "includes, but is not limited to," etc.).

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

While the present disclosure has been described herein with respect to certain illustrated embodiments, those of ordinary skill in the art will recognize and appreciate that the present invention is not so limited. Rather, many additions, deletions, and modifications to the illustrated and described embodiments may be made without departing from the scope of the invention as hereinafter claimed along with their legal equivalents. In addition, features from one embodiment may be combined with features of another embodiment while still being encompassed within the scope of the invention as contemplated by the inventor.

What is claimed is:

1. An apparatus, comprising:
   a fuse configured to store a bit of information;
   a first driver circuit including:
      a first input terminal electrically connected to the fuse; and
      a first output terminal electrically connected to a first latch input terminal; and
   a second driver circuit including:
      a second input terminal electrically connected to the fuse; and
      a second output terminal electrically connected to a second latch input terminal, the second latch input terminal electrically isolated from the first latch input terminal by the first driver circuit and the second driver circuit.

2. The apparatus of claim 1, wherein the fuse comprises a metal-oxide-semiconductor field effect transistor (MOSFET) capacitor (MOSCap).

3. The apparatus of claim 1, wherein at least one of the first driver circuit and the second driver circuit includes an inverter circuit.

4. The apparatus of claim 1, further comprising a fuse bank including a fuse array, the fuse array including the fuse.

5. The apparatus of claim 4, further comprising control circuitry including biasing circuitry configured to provide bias voltage potentials to fuses of the fuse array.

6. The apparatus of claim 1, further comprising control circuitry including a command generator configured to control an operational state of a latch circuit including the first latch input terminal and the second latch input terminal.

7. The apparatus of claim 1, further comprising a latch circuit including the first latch input terminal and the second latch input terminal.

8. The apparatus of claim 7, wherein the latch circuit includes a dual interlocked storage cell (DICE) latch circuit.

9. A method of operating a latch circuit, the method comprising:

applying an input signal to input terminals of a first driver circuit and a second driver circuit;

providing a first input signal to a first input terminal of the latch circuit responsive to the input signal;

providing a second input signal to a second input terminal of the latch circuit responsive to the input signal; and electrically isolating the first input terminal from the second input terminal with the first driver circuit and the second driver circuit.

10. The method of claim 9, wherein providing the first input signal to the first input terminal of the latch circuit and providing the second input signal to the second input terminal of the latch circuit comprises providing the first input signal and the second input signal to a dual interlocked storage cell (DICE) latch circuit including the first input terminal and the second input terminal.

11. The method of claim 9, further comprising latching the first input signal and the second input signal to a first output terminal and a second output terminal, respectively, of the latch circuit.

12. The method of claim 9, further comprising asserting control signals of the latch circuit to operate the latch circuit in a read state.

13. The method of claim 9, wherein applying the input signal to the input terminals of the first driver circuit and the second driver circuit comprises applying the input signal to a first inverter circuit including one of the input terminals of the first driver circuit and the second driver circuit and a second inverter circuit including another one of the input terminals of the first driver circuit and the second driver circuit.

14. The method of claim 9, further comprising applying a bias signal to a fuse to generate the input signal.

15. The method of claim 14, wherein applying the bias signal to the fuse comprises applying the bias signal to a metal-oxide-semiconductor field effect transistor (MOSFET) capacitor (MOSCap).

16. The method of claim 9, wherein applying the input signal to the input terminals of the first driver circuit and the second driver circuit comprises applying the input signal with a fuse.

17. A computing system, comprising:
one or more processors; and
one or more memory devices electrically connected to the one or more processors, the one or more memory devices including:
a latch circuit including:
a first input terminal; and
a second input terminal;
a first driver circuit electrically connected from an input terminal to the first input terminal; and
a second driver circuit electrically connected from the input terminal to the second input terminal, the first driver circuit and the second driver circuit electrically isolating the first input terminal from the second input terminal.

18. The computing system of claim 17, wherein the latch circuit includes a dual interlocked storage cell (DICE) latch circuit.

19. The computing system of claim 17, wherein at least one of the first driver circuit and the second driver circuit includes a complementary metal oxide semiconductor (CMOS) inverter.

20. The computing system of claim 17, wherein the first driver circuit includes a first digital buffer and the second driver circuit includes a second digital buffer.

* * * * *